United States Patent
Costello et al.

(10) Patent No.: US 10,506,737 B1
(45) Date of Patent: Dec. 10, 2019

(54) AIRFLOW FAIRINGS FOR CIRCUIT CARD ASSEMBLIES OF A COMMUNICATION SYSTEM

(71) Applicant: TE CONNECTIVITY CORPORATION, Berwyn, PA (US)

(72) Inventors: Brian Patrick Costello, Scotts Valley, CA (US); Chad William Morgan, Carneys Point, NJ (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/221,728

(22) Filed: Dec. 17, 2018

(51) Int. Cl.
| | |
|---|---|
| *H01R 13/00* | (2006.01) |
| *H05K 7/20* | (2006.01) |
| *G06F 1/20* | (2006.01) |
| *H01R 13/6596* | (2011.01) |
| *H01R 13/6587* | (2011.01) |

(52) U.S. Cl.
CPC ........... *H05K 7/20145* (2013.01); *G06F 1/20* (2013.01); *H01R 13/6587* (2013.01); *H01R 13/6596* (2013.01); *H05K 7/20209* (2013.01); *H05K 7/20709* (2013.01)

(58) Field of Classification Search
CPC ............ H01R 13/6587; H01R 13/6596; H05K 7/20145; H05K 7/20209; H05K 7/20709; G06F 1/20
USPC ........................................................ 439/485
See application file for complete search history.

(56) References Cited

U.S. PATENT DOCUMENTS

| | | | | |
|---|---|---|---|---|
| 5,991,837 A * | 11/1999 | Cronin | ............... | H05K 7/20145 361/688 |
| 7,135,827 B1 * | 11/2006 | Lampson | ............... | H02M 7/003 318/135 |
| 7,414,840 B1 * | 8/2008 | Polnyi | ................... | H01L 23/467 165/104.33 |
| 8,064,200 B1 * | 11/2011 | West | ................... | H05K 7/20563 361/694 |
| 8,085,554 B2 * | 12/2011 | Holdredge | ......... | H05K 7/20145 361/794 |
| 8,295,051 B2 | 10/2012 | Cheng | | |
| 8,393,917 B2 * | 3/2013 | Regnier | ............. | H05K 7/20709 439/485 |
| 9,069,535 B2 * | 6/2015 | Degner | ...................... | G06F 1/20 |
| 9,142,922 B2 * | 9/2015 | Regnier | ............. | H01R 13/6586 |
| 9,402,332 B2 * | 7/2016 | McKervey | ......... | H05K 7/20009 |
| 9,578,786 B1 * | 2/2017 | Beall | ................... | H05K 7/20754 |
| 9,655,284 B2 * | 5/2017 | Milligan | ............. | H05K 7/20145 |
| 9,661,783 B2 * | 5/2017 | Sakuma | ............... | H01F 27/085 |
| 9,825,408 B2 | 11/2017 | Henry et al. | | |
| 10,219,405 B2 * | 2/2019 | Baldwin, Jr. | ...... | H05K 7/20145 |
| 10,244,661 B2 * | 3/2019 | Scott | ................... | H05K 7/20727 |
| 10,244,666 B2 * | 3/2019 | Tsai | .......................... | G06F 1/20 |
| 10,271,455 B2 * | 4/2019 | Cho | .................... | H05K 7/20145 |
| 10,365,699 B2 * | 7/2019 | Han | ........................ | G06F 1/206 |

(Continued)

*Primary Examiner* — Abdullah A Riyami
*Assistant Examiner* — Vladimir Imas (57) ABSTRACT

An electrical connector assembly includes an electrical connector having a mating end and a mounting end mounted to a PCB. The electrical connector assembly includes an airflow fairing extending rearward from the electrical connector. The airflow fairing has a front end and a rear end. The airflow fairing has a curved profile between the front end and the rear end having a front cross-sectional area at the front end and a rear cross-sectional area at the rear end less than the front cross-sectional area.

20 Claims, 4 Drawing Sheets

(56) References Cited

U.S. PATENT DOCUMENTS

| | | | |
|---|---|---|---|
| 10,372,178 B2* | 8/2019 | Chang | G06F 1/206 |
| 2012/0099275 A1* | 4/2012 | Regnier | H05K 7/20145 |
| | | | 361/690 |
| 2014/0355185 A1* | 12/2014 | Ehlen | H05K 1/14 |
| | | | 361/679.5 |
| 2015/0181760 A1* | 6/2015 | Stephens | H05K 3/368 |
| | | | 361/695 |
| 2017/0005446 A1* | 1/2017 | Regnier | H01R 12/7005 |
| 2019/0069440 A1* | 2/2019 | Adrian | H05K 7/20145 |
| 2019/0227605 A1* | 7/2019 | Wiltzius | G06F 1/186 |

* cited by examiner

AIRFLOW FAIRINGS FOR CIRCUIT CARD ASSEMBLIES OF A COMMUNICATION SYSTEM

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented orthogonally to each other (for example, horizontally and vertically). The electrical connectors are provided at edges of both circuit cards and direct-mate to each other. However, the electrical connectors mounted to the circuit cards tend to disrupt airflow through the system, reducing airflow and/or requiring larger fans to pull sufficient airflow through the system.

A need remains for a cost effective and reliable communication system providing sufficient airflow through the system for cooling components of the system.

BRIEF DESCRIPTION OF THE INVENTION

In one embodiment, an electrical connector assembly is provided for a circuit card assembly of a communication system. The electrical connector assembly includes an electrical connector having a mating end at a front of the electrical connector configured to be mated with a mating electrical connector and a mounting end configured to be mounted to a printed circuit board (PCB). The electrical connector assembly includes an airflow fairing extending rearward from the electrical connector. The airflow fairing has a front end and a rear end. The airflow fairing has a tapered profile between the front end and the rear end and having a front cross-sectional area at the front end and a rear cross-sectional area at the rear end less than the front cross-sectional area.

In another embodiment, a circuit card assembly is provided for a communication system including a PCB and an electrical connector. The PCB has a first surface and a second surface and a mating edge between the first and second surfaces. The PCB has a connector mounting area on the first surface proximate to the mating edge. The electrical connector has a mating end at a front of the electrical connector configured to be mated with a mating electrical connector. The electrical connector has a mounting end configured to be mounted to the first surface at the connector mounting area of the PCB. An airflow fairing extends rearward from the electrical connector. The airflow fairing has a front end and a rear end. The airflow fairing has a first end between the front end and the rear end. The first end is mounted to the first surface of the PCB rearward of the connector mounting area. The airflow fairing has a tapered profile between the front end and the rear end. The airflow fairing has a front cross-sectional area at the front end and a rear cross-sectional area at the rear end being less than the front cross-sectional area.

In a further embodiment, a communication system is provided including a first circuit card assembly and a second circuit card assembly. The first circuit card assembly has a first PCB and a first electrical connector mounted to the first PCB proximate to a mating edge of the first PCB. The first PCB extends along a mating axis. The first electrical connector has a mating end at a front of the first electrical connector and a mounting end mounted to the first PCB. The mating end is oriented perpendicular to the mounting end. The first electrical connector includes a first housing at the mating end. The first electrical connector includes first contact modules coupled to the first housing and extending rearward from the first housing. The first contact modules are provided at the mounting end. The first contact modules include first contacts having mating ends extending into the housing and terminating ends configured to be terminated to the first PCB. The first electrical connector includes a first airflow fairing extending rearward from the first contact modules. The first airflow fairing has a front end and a rear end. The first airflow fairing has a curved profile between the front end and the rear end. The first airflow fairing has a front cross-sectional area at the front end and a rear cross-sectional area at the rear end being less than the front cross-sectional area. The second circuit card assembly has a second PCB and a second electrical connector mounted to the second PCB proximate to a mating edge of the second PCB. The second PCB extends along a mating axis. The second electrical connector has a mating end at a front of the second electrical connector and a mounting end mounted to the second PCB. The mating end is oriented perpendicular to the mounting end. The second electrical connector includes a second housing at the mating end. The second electrical connector includes second contact modules coupled to the second housing and extending rearward from the second housing. The second contact modules are provided at the mounting end. The second contact modules include second contacts having mating ends extending into the housing and terminating ends configured to be terminated to the second PCB. The second electrical connector includes a second airflow fairing extending rearward from the second contact modules. The second airflow fairing has a front end and a rear end. The second airflow fairing has a curved profile between the front end and the rear end. The second airflow fairing has a front cross-sectional area at the front end and a rear cross-sectional area at the rear end being less than the front cross-sectional area.

DETAILED DESCRIPTION OF THE INVENTION

Figure 1:
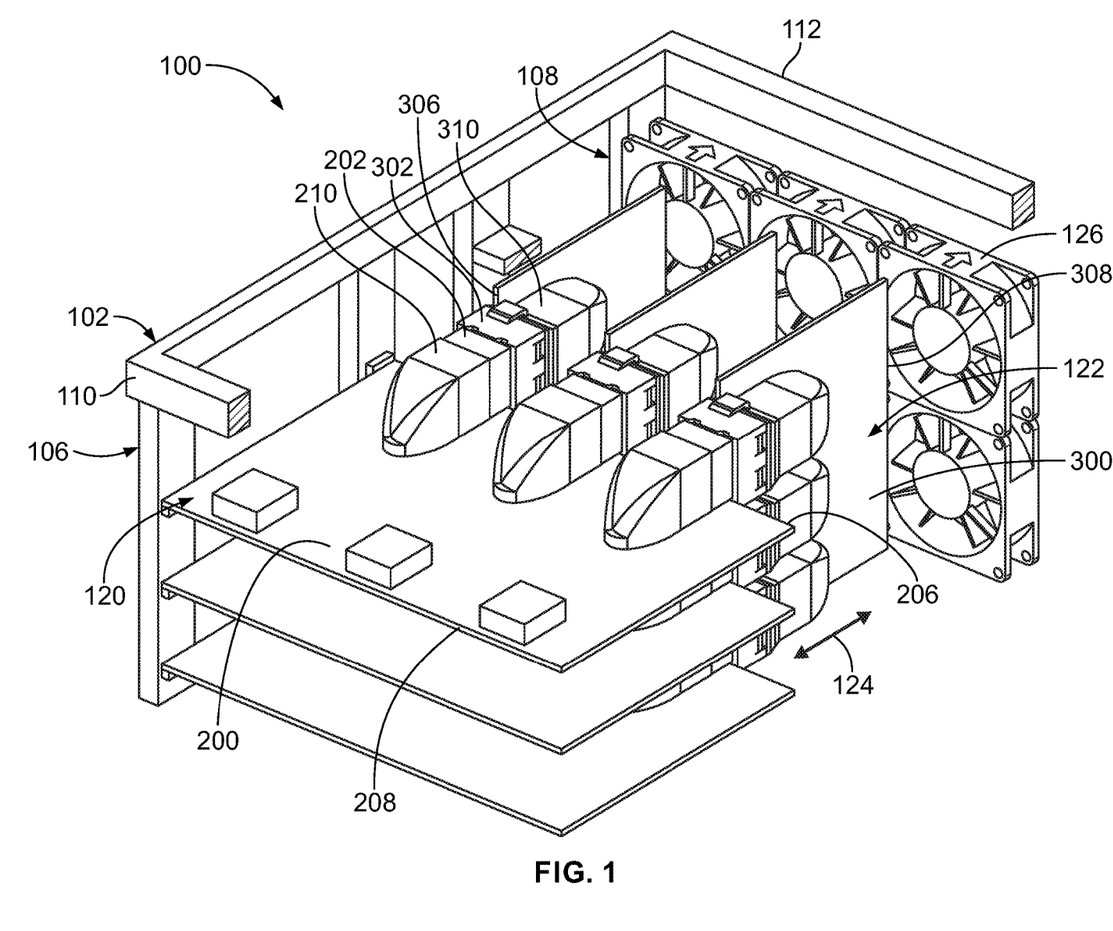
FIG. 1 illustrates a communication system formed in accordance with an exemplary embodiment including first and second circuit card assemblies.

FIG. 1 illustrates a communication system 100 formed in accordance with an exemplary embodiment. The communication system 100 includes a frame or chassis 102 configured to hold communication components, such as network components (e.g., circuit card assemblies). Optionally, the chassis 102 may include a cabinet (not shown) surrounding components of the communication system 100. In an exemplary embodiment, the chassis 102 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies to differentiate from the circuit card assemblies 122, which may be referred to hereinafter as second circuit card assemblies 122 and/or rear circuit card assemblies 122. The first circuit card assembly 120 is a mating circuit card assembly for the second circuit card assembly 122. Similarly, the second circuit card assembly 122 is a mating circuit card assembly for the first circuit card assembly 120. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the chassis 102 through the front end 110 while the rear circuit card assemblies 122 may be loaded into the chassis 102 through the rear end 112. The circuit card assemblies 120, 122 may be mated in a mating direction 124. In an exemplary embodiment, the communication system 100 includes one or more fans 126 for moving air through the racks 106, 108 for cooling components of the circuit card assemblies 120, 122.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122. However, the other of the circuit card assembly 120 or the circuit card assembly 122 may additionally include such components. Furthermore, the components may be described herein with or without the "first" label or the "second" label.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. The first PCB 200 extends between a first mating edge 206 at a front of the PCB 200 and a rear edge 208 opposite the mating edge 206. The electrical connectors 202 may be provided at or near the first mating edge 206. In an exemplary embodiment, the electrical connectors 202 are high speed electrical connectors, such as right-angle, high-speed differential pair electrical connectors. Other types of electrical connectors 202 may be provided in alternative embodiments. In various embodiments, other electrical components, such as memory chips, processors, I/O modules, cable connectors, batteries, fans, signal processing devices, circuit components, and the like may be provided on the first PCB 200, such as at or near the rear edge 208.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. The second PCB 300 extends between a second mating edge 306 at a front of the PCB 300 and a rear edge 308 opposite the mating edge 306. The first and second mating edges 206, 306 of the first and second PCBs 200, 300 face each other when the first and second circuit card assemblies 120, 122 are mated. For example, the fronts of the PCBs 200, 300 face each other and the rear edges 208, 308 face away from each other. The electrical connectors 302 may be provided at or near the first mating edge 306. In an exemplary embodiment, the electrical connectors 302 are high speed electrical connectors, such as right-angle, high-speed differential pair electrical connectors. Other types of electrical connectors 302 may be provided in alternative embodiments. In various embodiments, other electrical components, such as memory chips, processors, I/O modules, cable connectors, batteries, fans, signal processing devices, circuit components, and the like may be provided on the second PCB 300, such as at or near the rear edge 308.

The first and second electrical connectors 202, 302 are direct-plug, orthogonal (DPO) electrical connectors that are directly mated together, thus eliminating the need for any mid-plane circuit board, which would completely block airflow through the communication system 100. Alternately air holes can be made in the backplane to allow airflow but the remaining backplane material will significantly limit the cooling effectiveness. The electrical connectors 202, 302 are orthogonal such that the first and second PCBs 200, 300 may be oriented perpendicular to each other, thus allowing electrical connection or networking of various circuit card assemblies 120, 122. In an exemplary embodiment, the first and second circuit card assemblies 120, 122 may be oriented such that the first and second PCBs 200, 300 are parallel to the mating direction 124. As such, an airflow stream moves through the chassis 102 generally unobstructed by the first and second PCBs 200, 300. The airflow stream moves front-to-rear or rear-to-front through the chassis 102. The first and second electrical connectors 202, 302 are arranged in the airflow stream at the interface between the first and second circuit card assemblies 120, 122. In an exemplary embodiment, the first circuit card assembly 120 includes a first airflow fairing 210 associated with the first electrical connector 202 and the second circuit card assembly 122 includes a second airflow fairing 310 associated with the second electrical connector 302. The airflow fairings 210, 310 are arranged in the airflow stream.

The airflow fairings 210, 310 improve the airflow stream flowing through the chassis 102. The airflow fairings 210, 310 reduce drag of the airflow stream flowing past the electrical connectors 202, 302. The airflow fairings 210, 310 reduce pressure drop across the electrical connectors 202, 302. The airflow fairings 210, 310 reduce turbulence across the electrical connectors 202, 302. In an exemplary embodiment, the airflow fairings 210, 310 have airfoil shapes. The airflow fairings 210, 310 may be cone shaped. The airflow fairings 210, 310 are curved for improved airflow around the electrical connectors 202, 302. In various embodiments, the airflow fairings 210, 310 are separate and discrete from the electrical connectors 202, 302 and coupled thereto. In other various embodiments, the airflow fairings 210, 310 are integral with portions of the electrical connectors 202, 302, such as with the housing or the contact modules of the electrical connectors 202, 302. In various embodiments, the airflow fairings 210, 310 may be molded parts, such as molded plastic. In other various embodiments, the airflow fairings 210, 310 may be manufactured from metal, such as being stamped and formed parts.

Figure 2:
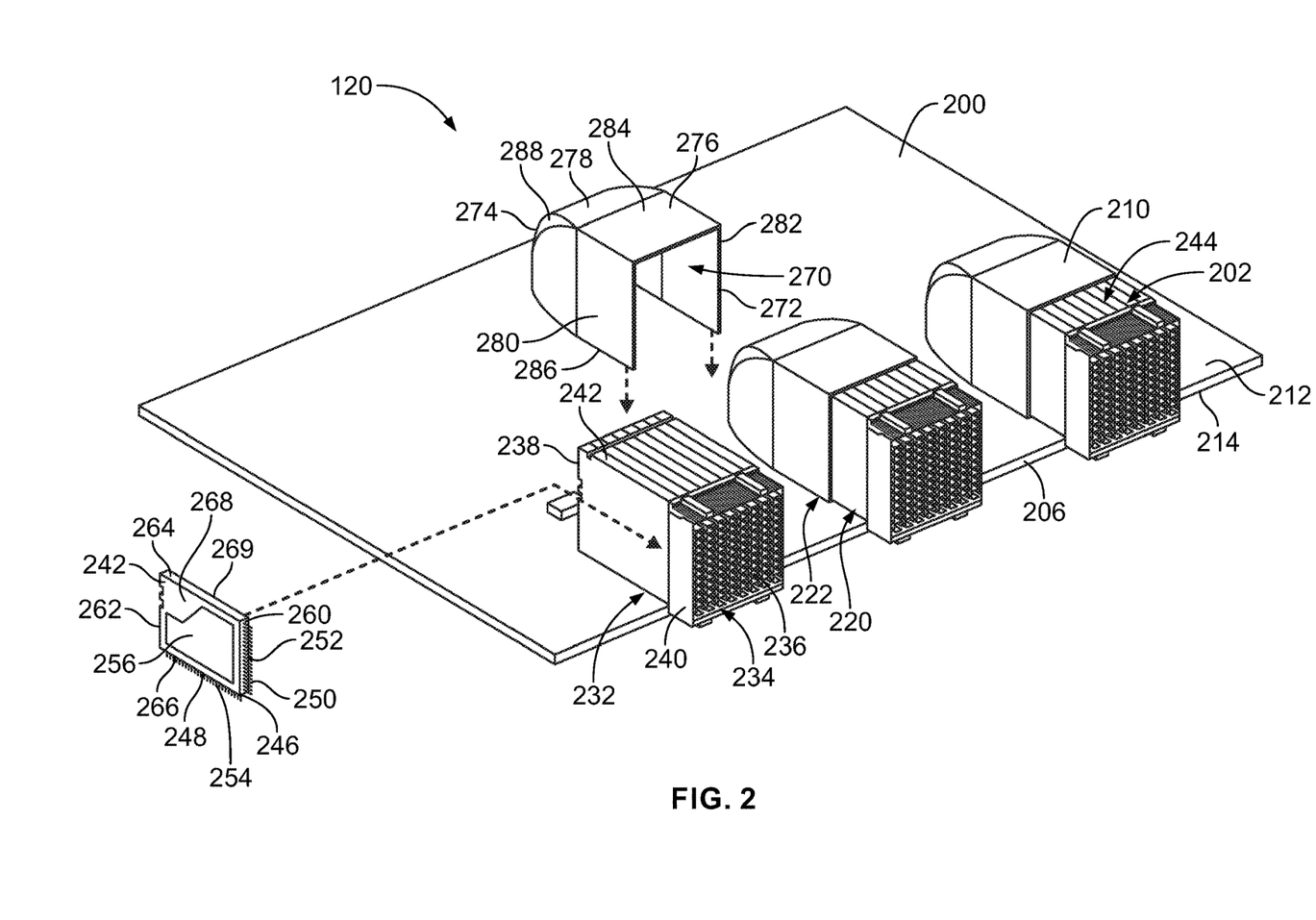
FIG. 2 is a perspective view of a portion of the communication system showing the first circuit card assembly in accordance with an exemplary embodiment.

FIG. 2 is a perspective view of a portion of the communication system 100 showing the first circuit card assembly 120 in accordance with an exemplary embodiment. The first circuit card assembly 120 includes the first PCB 200, the first electrical connector 202 mounted to the PCB 200, and the first airflow fairing 210. The PCB 200 includes a first surface 212 and a second surface 214 being the main surfaces of the PCB 200. The mating edge 206 extends between the first and second surfaces 212, 214. In the illustrated embodiment, the first surface 212 is an upper surface and the second surface 214 is a lower surface; however, the PCB 200 may have other orientations in alternative embodiments.

The first PCB 200 includes a connector mounting area 220 for the electrical connector 202 on the first surface 212. Optionally, the mounting area 220 is adjacent the mating edge 206. The electrical connector 202 is terminated to the PCB 200 at the mounting area 220. For example, contacts 250 of the electrical connector 202 may be soldered or press-fit to the PCB 200 at the connector mounting area 220. The connector mounting area 220 may include plated vias that receive compliant pins or solder tails of the contacts 250 of the electrical connector 202 for termination of the contacts 250 to the PCB 200. Optionally, at least a portion of the electrical connector 202 may extend beyond the mating edge 206. In an exemplary embodiment, the PCB 200 includes a fairing mounting area 222 rearward of the connector mounting area 220, such as further from the mating edge 206 than the connector mounting area 220. Optionally, one or more electrical components may be mounted to the PCB 200 in the fairing mounting area 222 such that the airflow fairing 210 covers such electrical component(s).

The first electrical connector 202 is mounted to the PCB 200 at the mounting area 220. In the illustrated embodiment, the electrical connector 202 is a right-angle connector having a mounting end 232 perpendicular to a mating end 234. For example, the mounting end 232 may be provided at a bottom of the electrical connector 202 and the mating end 234 may be provided at a front of the electrical connector 202. The electrical connector 202 extends between a front 236 and a rear 238 opposite the front 236. The mounting end 232 extends between the front 236 and the rear 238 at the bottom of the electrical connector 202. The mounting end 232 is mounted to the PCB 200. For example, the electrical connector 202 is mechanically and electrically terminated to the PCB 200 at the mounting end 232. In the illustrated embodiment, the mating end 234 generally faces forward for mating with the second circuit card assembly 122 (shown in FIG. 1).

In an exemplary embodiment, the electrical connector 202 includes a housing 240 at the mating end 234. The electrical connector 202 includes contact modules 242 arranged in a contact module stack 244. The contact modules 242 are coupled to the rear of the housing 240. Each contact module 242 has a mating end 246 and a mounting end 248. The mounting ends 248 of the contact modules 242 define the mounting end 232 of the electrical connector 202. The mounting ends 248 of the contact modules 242 are configured to be mounted to the PCB 200. In an exemplary embodiment, the contact modules 242 includes ground shields 256 having ground contacts, such as mating beams, configured to be electrically connected to ground contacts of the second circuit card assembly 122.

In an exemplary embodiment, each contact module 242 includes a plurality of contacts 250 configured to be electrically connected to the second circuit card assembly 122. The contacts 250 extends between a mating end 252 and a terminating end 254. The mating ends 252 of the contacts 250 may be pins, sockets, spring beams, or other types of contacts for mating with the second circuit card assembly 122. The terminating ends 254 may be compliant pins, solder tails, solder balls or other types of terminating ends for electrical connection to the PCB 200. In various embodiments, the contacts 250 are stamped and formed contacts. The contacts 250 may be formed from a lead frame that is overmolded to form the contact module 242. Other types of contact modules 242 may be provided in alternative embodiments. In other various embodiments, the electrical connector 202 may be provided without the contact modules 242, rather having the contacts 250 held directly by the housing 240 rather than being formed as contact modules.

Each contact module 242 includes a front 260, a rear 262, a top 264, a bottom 266, a first side 268 and a second side 269. The contact module 242 is generally rectangular shaped. In the contact module stack 244, the rear sides 262 of the contact modules 242 are generally co-planer along a vertical plane and the top sides 264 of the contact modules 242 are generally co-planer along a horizontal plane. In the illustrated embodiment, the front 260 defines the mating end 246 and the bottom 266 defines the mounting end 248. The signal contacts 250 transition between the front 260 and the bottom 266. In the illustrated embodiment, the front 260 defines the mating end 246 and the bottom 266 defines the mounting end 248. The signal contacts 250 transition between the front 260 and the bottom 266. The mating ends 252 of the contacts 250 extend forward of the front 260 for loading into the housing 240. The terminating ends 254 of the contacts 250 extend downward from the bottom 266 for terminating to the PCB 200.

In an exemplary embodiment, the airflow fairing 210 includes a space 270 that receives portions of the contact modules 242. The airflow fairing 210 extends between a front end 272 and a rear end 274. In an exemplary embodiment, the airflow fairing 210 includes a hood 276 at the front end 272 that receives portions of the contact modules 242. The hood 276 is sized and shaped to receive the contact module stack 244. For example, the hood 276 may extend along the sides and the tops of the contact modules 242. In an exemplary embodiment, the airflow fairing 210 includes a cone 278 at the rear end 274. The cone 278 tapers inward to create an aerodynamic structure. The cone 278 has a reduced cross-section compared to the hood 276. For example, the hood 276 has a front cross-sectional area at the front end 272 and the cone 278 has a rear cross-sectional area at the rear end 274 that is less than the front cross-sectional area of the hood 276. Optionally, the hood 276 may have a constant cross-sectional area and the cone 278 may have a variable cross-sectional area that becomes smaller between a rear of the hood 276 and the rear end 274. The hood may be generally box-shaped. For example, the hood 276 may be cubic having a generally constant cross-section and the cone 278 may be tapered from the rear of the hood 276 to the rear end 274.

The airflow fairing 210 has a first side 280 and a second side 282 that extends between the front end 272 and the rear end 274. In an exemplary embodiment, the first and second sides 280, 282 are tapered inward from the front end 272 to the rear end 274. Optionally, the first and second sides 280, 282 may be curved inward from the hood 276 to the rear end 274.

The airflow fairing 210 has a first end 284 and a second end 286 between the front end 272 and the rear end 274. The first and second ends 284, 286 extend between the first and second sides 280, 282. In the illustrated embodiment, the first end 284 defines a top of the airflow fairing 210 and the second end 286 defines a bottom of the airflow fairing 210. Optionally, the second end 286 may be open and the first end 284 may be closed. The second end 286 is configured to be mounted along the surface 212 of the PCB 200. In an exemplary embodiment, the first end 284 is tapered inward from the front end 272 to the rear end 274. Optionally, the first end 284 may be curved inward from the hood 276 to the rear end 274. The airflow fairing 210 has corners 288 transitioning between the first end 284 and the first and second sides 280, 282. The corners 288 may have a compound curvature transitioning between the first end 284 and the corresponding side 280, 282.

In an exemplary embodiment, the airflow fairing 210 is coupled to the electrical connector 202. For example, the airflow fairing 210 may be coupled to the contact modules 242 and/or the housing 240. The space 270 receives the contact modules 242. The airflow fairing 210 extends rearward of the contact modules 242 along the PCB 200. The space 270 may be open rearward of the contact modules 242 above the PCB 200. The volume of the space 270 may be sufficient to receive one or more electrical components therein.

The airflow fairing 210 enhances aerodynamic performance of the air flowing past the electrical connector 202. For example, the airflow fairing 210 may reduce turbulence of airflow rearward of the airflow fairing 210. In an exemplary embodiment, the electrical connectors 202 on the PCB 200 are spaced apart to allow airflow therebetween. The airflow fairings 210 enhances airflow between the electrical connectors 202. The airflow fairings 210 enhances airflow over the top of the electrical connectors 202.

Figure 3:
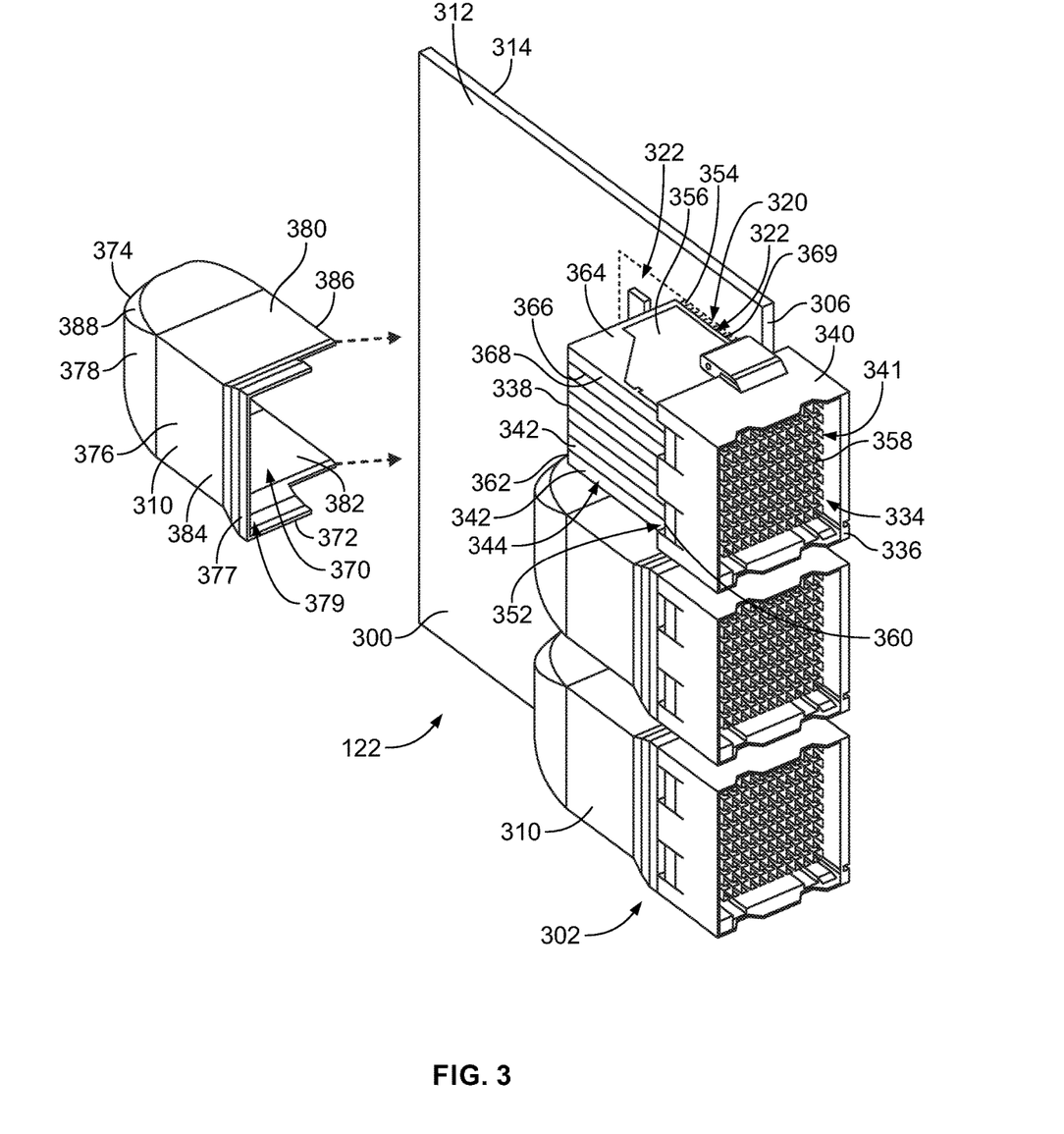
FIG. 3 is a perspective view of a portion of the communication system showing the second circuit card assembly in accordance with an exemplary embodiment.

FIG. 3 is a perspective view of a portion of the communication system 100 showing the second circuit card assembly 122 in accordance with an exemplary embodiment. The second circuit card assembly 122 includes the second PCB 300, the second electrical connector 302 mounted to the PCB 300, and the second airflow fairing 310. The PCB 300 includes a first surface 312 and a second surface 314 being the main surfaces of the PCB 300. The mating edge 306 extends between the first and second surfaces 312, 314. In the illustrated embodiment, the PCB 300 is oriented vertically such that the first and second surfaces 312, 314 are side surfaces; however, the PCB 300 may have other orientations in alternative embodiments.

The second PCB 300 includes a connector mounting area 320 for the electrical connector 302 on the first surface 312. Optionally, the mounting area 320 is adjacent the mating edge 306. The electrical connector 302 is terminated to the PCB 300 at the mounting area 320. For example, contacts 350 of the electrical connector 302 may be soldered or press-fit to the PCB 300 at the connector mounting area 320. The connector mounting area 320 may include plated vias that receive compliant pins or solder tails of the contacts 350 of the electrical connector 302 for termination of the contacts 350 to the PCB 300. Optionally, at least a portion of the electrical connector 302 may extend beyond the mating edge 306. In an exemplary embodiment, the PCB 300 includes a fairing mounting area 322 rearward of the connector mounting area 320, such as further from the mating edge 306 than the connector mounting area 320. Optionally, one or more electrical components may be mounted to the PCB 300 in the fairing mounting area 322 such that the airflow fairing 310 covers such electrical component(s).

The second electrical connector 302 is mounted to the PCB 300 at the mounting area 320. In the illustrated embodiment, the electrical connector 302 is a right-angle connector having a mounting end 332 perpendicular to a mating end 334. For example, the mounting end 332 may be provided at a side of the electrical connector 302 and the mating end 334 may be provided at a front of the electrical connector 302. The electrical connector 302 extends between a front 336 and a rear 338 opposite the front 336. The mounting end 332 extends between the front 336 and the rear 338 at the side of the electrical connector 302. The mounting end 332 is mounted to the PCB 300. For example, the electrical connector 302 is mechanically and electrically terminated to the PCB 300 at the mounting end 332. In the illustrated embodiment, the mating end 334 generally faces forward for mating with the first circuit card assembly 120 (shown in FIG. 2).

In an exemplary embodiment, the electrical connector 302 includes a housing 340 at the mating end 334. The housing 340 may have a cavity 341 that receives the contacts 350 and is configured to receive the housing 240 (shown in FIG. 2) of the first electrical connector 202 (shown in FIG. 2). The electrical connector 302 includes contact modules 342 arranged in a contact module stack 344. The contact modules 342 may be similar to the contact modules 242 (shown in FIG. 2). The contact modules 342 are coupled to the rear of the housing 340. Each contact module 342 has a mating end 346 and a mounting end 348. The mounting ends 348 of the contact modules 342 define the mounting end 332 of the electrical connector 302. The mounting ends 348 of the contact modules 342 are configured to be mounted to the PCB 300. In an exemplary embodiment, the contact modules 342 may include ground shields 356 having ground contacts 358 configured to be electrically connected to the first electrical connector 202, such as to corresponding ground contacts 258 (shown in FIG. 2).

In an exemplary embodiment, each contact module 342 includes a plurality of contacts 350 configured to be electrically connected to corresponding contacts 250 (shown in FIG. 2) of the first circuit card assembly 122. The contacts 350 extends between a mating end 352 and a terminating end 354. The mating ends 352 of the contacts 350 may be pins, sockets, spring beams, or other types of contacts for mating with the second circuit card assembly 122. The terminating ends 354 may be compliant pins, solder tails, solder balls or other types of terminating ends for electrical connection to the PCB 300. In various embodiments, the contacts 350 are stamped and formed contacts. The contacts 350 may be formed from a lead frame that is overmolded to form the contact module 342. Other types of contact modules 342 may be provided in alternative embodiments. In other various embodiments, the electrical connector 302 may be provided without the contact modules 342, rather having the contacts 350 held directly by the housing 340 rather than being formed as contact modules.

Each contact module 342 includes a front 360, a rear 362, a top 364, a bottom 366, a first side 368 and a second side 369. The contact module 342 is generally rectangular shaped. In the contact module stack 344, the rears 362 of the contact modules 342 are generally co-planer along a vertical plane and the first sides 368 of the contact modules 342 are generally co-planer along a vertical plane. In the illustrated embodiment, the front 360 defines the mating end 346 and the second side 369 defines the mounting end 348. The signal contacts 350 transition between the front 360 and the second side 369. In the illustrated embodiment, the front 360 defines the mating end 346 and the second side 369 defines the mounting end 348. The signal contacts 350 transition between the front 360 and the second side 369. The mating ends 352 of the contacts 350 extend forward of the front 360 for loading into the housing 340. The terminating ends 354 of the contacts 350 extend outward from the second side 369 for terminating to the PCB 300.

In an exemplary embodiment, the airflow fairing 310 includes a space 370 that receives portions of the contact modules 342. The airflow fairing 310 extends between a front end 372 and a rear end 374. In an exemplary embodiment, the airflow fairing 310 includes a hood 376 at the front end 372 that receives portions of the contact modules 342. The hood 376 is sized and shaped to receive the contact module stack 344. For example, the hood 376 may extend along the side, the top and the bottom of the contact module stack 344. In an exemplary embodiment, the airflow fairing 310 includes a lip 377 extending forward from the hood 376. The lip 377 forms a pocket 379 configured to receive a portion of the housing 340. The lip 377 may be bulged outward from the hood 376 to increase the cross-sectional area of the lip 377 compared to the cross-sectional area of the hood 376. The lip 377 is bulged outward to accommodate the increased size and shape of the housing 340 compared to the contact modules 342. The lip 377 is contoured to the hood 376 to form a smooth transition from the lip 377 to the hood 376. The lip 377 creates a smooth transition from the housing 340 to the hood 376.

In an exemplary embodiment, the airflow fairing 310 includes a cone 378 at the rear end 374. The cone 378 tapers inward to create an aerodynamic structure. The cone 378 has a reduced cross-section compared to the hood 376. For example, the hood 376 has a front cross-sectional area at the front end 372 and the cone 378 has a rear cross-sectional area at the rear end 374 that is less than the front cross-sectional area of the hood 376. Optionally, the hood 376 may have a constant cross-sectional area and the cone 378 may have a variable cross-sectional area that becomes smaller between the hood 376 and the rear end 374.

The airflow fairing 310 has a first side 380 and a second side 382 that extends between the front end 372 and the rear end 374. In the illustrated embodiment, the first side 380 defines a top of the airflow fairing 310 and the second side 320 defines a bottom of the airflow fairing 310. In an exemplary embodiment, the first and second sides 380, 382 are tapered inward from the front end 372 to the rear end 374. Optionally, the first and second sides 380, 382 may be curved inward from the hood 376 to the rear end 374.

The airflow fairing 310 has a first end 384 and a second end 386 between the front end 372 and the rear end 374. The first and second ends 384, 386 extend between the first and second sides 380, 382. Optionally, the second end 386 may be open and the first end 384 may be closed. The second end 386 is configured to be mounted along the surface 312 of the PCB 300. In an exemplary embodiment, the first end 384 is tapered inward from the front end 372 to the rear end 374. Optionally, the first end 384 may be curved inward from the hood 376 to the rear end 374. The airflow fairing 310 has corners 388 transitioning between the first end 384 and the first and second sides 380, 382. The corners 388 may have a compound curvature transitioning between the first end 384 and the corresponding side 380, 382.

In an exemplary embodiment, the airflow fairing 310 is coupled to the electrical connector 302. For example, the airflow fairing 310 may be coupled to the contact modules 342 and/or the housing 340. The space 370 receives the contact modules 342 and the pocket 379 receives the housing 340. The airflow fairing 310 extends rearward of the contact modules 342 along the PCB 300. The space 370 may be open rearward of the contact modules 342 above the PCB 300. The volume of the space 370 may be sufficient to receive one or more electrical components therein.

The airflow fairing 310 enhances aerodynamic performance of the air flowing past the electrical connector 302. For example, the airflow fairing 310 may reduce turbulence of airflow rearward of the airflow fairing 310. In an exemplary embodiment, the electrical connectors 302 on the PCB 300 are spaced apart to allow airflow therebetween. The airflow fairings 310 enhances airflow between the electrical connectors 302. The airflow fairings 310 enhances airflow over the top of the electrical connectors 302.

Figure 4:
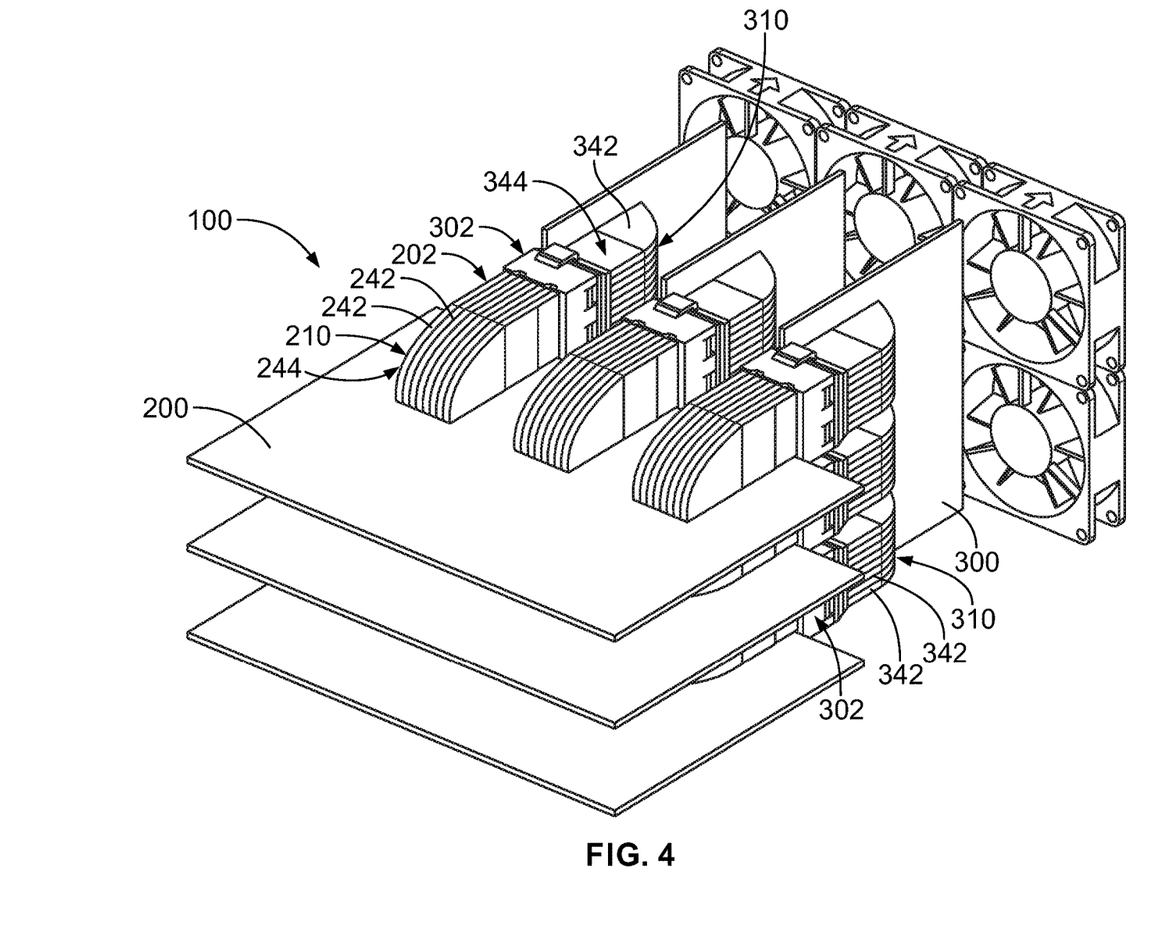
FIG. 4 illustrates the communication system formed in accordance with an exemplary embodiment.

FIG. 4 illustrates the communication system 100 formed in accordance with an exemplary embodiment. In the illustrated embodiment, the first and second airflow fairings 210, 310 are integral with the electrical connectors 202, 302, respectively, rather than being a separate and discrete component mounted to the PCBs 200, 300 separately from the electrical connectors 202, 302. For example, the first airflow fairing 210 is defined by the contact modules 242 of the contact module stack 244. The bodies of the contact modules 242 are shaped to form the airflow fairing 210. The first airflow fairing 210 is co-molded with the contact modules 242 around the lead frames defining the contacts 250. Similarly, the second airflow fairing 310 is defined by the contact modules 342 of the contact module stack 344. The bodies of the contact modules 342 are shaped to form the airflow fairing 310. The second airflow fairing 310 is co-molded with the contact modules 342 around the lead frames defining the contacts 350.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector assembly for a circuit card assembly of a communication system, the electrical connector assembly comprising:
   an electrical connector having a mating end at a front of the electrical connector configured to be mated with a mating electrical connector, the electrical connector having a mounting end configured to be mounted to a printed circuit board (PCB); and
   an airflow fairing extending rearward from the electrical connector, the airflow fairing having a front end and a rear end, the airflow fairing having a tapered profile at the rear end, the airflow fairing having a front cross-sectional area at the front end and a rear cross-sectional area at the rear end, the rear cross-sectional area being less than the front cross-sectional area.

2. The electrical connector assembly of claim 1, wherein the airflow fairing includes a hood at the front end and a cone at the rear end, the hood receiving the electrical connector, the cone being tapered to the rear end.

3. The electrical connector assembly of claim 2, wherein the hood has a constant cross-sectional area and the cone has a variable cross-sectional area between the hood and the rear end.

4. The electrical connector assembly of claim 1, wherein the airflow fairing includes a first side and a second side opposite the first side, the first and second sides being tapered inward from the front end to the rear end.

5. The electrical connector assembly of claim 4, wherein the airflow fairing includes a first end between the first side and the second side, the first end being tapered inward from the front end to the rear end.

6. The electrical connector assembly of claim 5, wherein the airflow fairing includes a second end opposite the first end, the second end being coupled to the PCB.

7. The electrical connector assembly of claim 1, wherein the electrical connector includes a housing and contact modules received in the housing, the airflow fairing being separate and discrete from the housing and the contact modules of the electrical connector, the airflow fairing being coupled to at least one of the housing and the contact modules.

8. The electrical connector assembly of claim 7, wherein the airflow fairing receives a portion of the housing.

9. The electrical connector assembly of claim 7, wherein the airflow fairing includes a pocket at the front end, the pocket receiving a rear of the housing.

10. The electrical connector assembly of claim 1, wherein the airflow fairing includes a space, the electrical connector partially filling the space, the space configured to receive at least one electrical component mounted to the PCB rearward of the electrical connector.

11. The electrical connector assembly of claim 1, wherein the airflow fairing reduces turbulence of airflow rearward of the airflow fairing.

12. The electrical connector assembly of claim 1, wherein the electrical connector includes a housing and contact modules received in the housing, the airflow fairing being integral with the contact modules.

13. A circuit card assembly for a communication system comprising:
   a printed circuit board (PCB) having a first surface and a second surface and a mating edge between the first and second surfaces, the PCB having a connector mounting area on the first surface proximate to the mating edge;
   an electrical connector having a mating end at a front of the electrical connector configured to be mated with a mating electrical connector, the electrical connector having a mounting end configured to be mounted to the first surface at the connector mounting area of the PCB; and
   an airflow fairing extending rearward from the electrical connector, the airflow fairing having a front end and a rear end, the airflow fairing having a first end between the front end and the rear end, the first end being mounted to the first surface of the PCB rearward of the connector mounting area, the airflow fairing having a tapered profile between the front end and the rear end, the airflow fairing having a front cross-sectional area at the front end and a rear cross-sectional area at the rear end, the rear cross-sectional area being less than the front cross-sectional area.

14. The circuit card assembly of claim 13, wherein the airflow fairing includes a hood at the front end and a cone at the rear end, the hood receiving the electrical connector, the cone being tapered to the rear end.

15. The circuit card assembly of claim 13, wherein the airflow fairing includes a first side and a second side opposite the first side, the first and second sides being tapered inward from the front end to the rear end, the airflow fairing including a first end between the first side and the second side, the first end being tapered inward from the front end to the rear end, the airflow fairing including a second end opposite the first end, the second end being coupled to the PCB.

16. A communication system comprising:
   a first circuit card assembly having a first printed circuit board (PCB) and a first electrical connector mounted to the first PCB proximate to a mating edge of the first PCB, the first PCB extending along a mating axis, the first electrical connector having a mating end at a front of the first electrical connector and a mounting end mounted to the first PCB, the mating end being oriented perpendicular to the mounting end, the first electrical connector including a first housing at the mating end, the first electrical connector including first contact modules coupled to the first housing and extending rearward from the first housing, the first contact modules being provided at the mounting end, the first contact modules including first contacts having mating ends extending into the housing and terminating ends configured to be terminated to the first PCB, the first electrical connector including a first airflow fairing extending rearward from the first contact modules, the first airflow fairing having a front end and a rear end, the first airflow fairing having a tapered profile between the front end and the rear end, the first airflow fairing having a front cross-sectional area at the front end and a rear cross-sectional area at the rear end, the rear cross-sectional area being less than the front cross-sectional area; and a second circuit card assembly having a second PCB and a second electrical connector mounted to the second PCB proximate to a mating edge of the second PCB, the second PCB extending along the mating axis, the second electrical connector is mated with the first electrical connector along the mating axis, the second electrical connector having a mating end at a front of the second electrical connector mated to the mating end of the first electrical connector and a mounting end mounted to the second PCB, the mating end being oriented perpendicular to the mounting end, the second electrical connector including a second housing at the mating end, the second electrical connector including second contact modules coupled to the second housing and extending rearward from the second housing, the second contact modules being provided at the mounting end, the second contact modules including second contacts having mating ends extending into the second housing for mating with corresponding first contacts and terminating ends configured to be terminated to the second PCB, the second electrical connector including a second airflow fairing extending rearward from the second contact modules, the second airflow fairing having a front end and a rear end, the second airflow fairing having a tapered profile between the front end and the rear end, the second airflow fairing having a front cross-sectional area at the front end and a rear cross-sectional area at the rear end, the rear cross-sectional area being less than the front cross-sectional area.

17. The communication system of claim 16, wherein the first PCB is oriented perpendicular to the second PCB.

18. The communication system of claim 16, wherein the first airflow fairing includes a hood at the front end and a cone at the rear end, the hood of the first airflow fairing receiving the first contact modules, the cone being tapered to the rear end, and wherein the second airflow fairing includes a hood at the front end and a cone at the rear end, the hood of the second airflow fairing receiving the second contact modules, the cone being tapered to the rear end.

19. The communication system of claim 16, wherein the first airflow fairing includes a first side and a second side opposite the first side, the first and second sides being tapered inward from the front end to the rear end, the first airflow fairing including a first end between the first side and the second side, the first end being tapered inward from the front end to the rear end, the first airflow fairing including a second end opposite the first end, the second end being coupled to the first PCB.

20. The communication system of claim 16, wherein the first airflow fairing includes a first end being tapered inward from the front end to the rear end, the first airflow fairing including a second end opposite the first end, the second and being coupled to the first PCB, wherein the second airflow fairing includes a first end being tapered inward from the front end to the rear end, the second airflow fairing including a second end opposite the first end, the second end being coupled to the first PCB, and wherein the second end of the first airflow fairing is oriented perpendicular to the second end of the second airflow fairing.

* * * * *